United States Patent [19]

De Gennaro et al.

[11] 4,419,757
[45] Dec. 6, 1983

[54] TRANSFORMERLESS BIPOLAR CONVERTER

[75] Inventors: Cosmo H. De Gennaro, Long Valley; Neil Hooper, Randolph Township, Morris County, both of N.J.

[73] Assignee: Bell Telephone Laboratories, Incorporated, Murray Hill, N.J.

[21] Appl. No.: 244,297

[22] Filed: Mar. 16, 1981

[51] Int. Cl.³ .............................................. H03K 5/01
[52] U.S. Cl. ..................................... 375/17; 307/260; 340/347 DD
[58] Field of Search ........................... 320/1; 328/127; 307/260, 261, 109; 332/1, 11; 375/17, 104; 340/347 DD

[56] References Cited

U.S. PATENT DOCUMENTS

| | | | |
|---|---|---|---|
| 2,671,858 | 3/1954 | Fong | 320/1 |
| 2,773,221 | 12/1956 | Shaw | 320/1 |
| 3,334,352 | 8/1967 | Abbondante | 346/76 |
| 3,803,500 | 4/1974 | Taudt et al. | 307/260 |
| 3,993,953 | 11/1976 | Lender et al. | 340/347 DD |
| 4,013,955 | 3/1977 | Wagner | 307/260 |
| 4,038,605 | 7/1977 | Elder et al. | 375/104 |
| 4,083,005 | 4/1978 | Looschen | 332/9 R |
| 4,313,067 | 1/1982 | White | 328/127 |

OTHER PUBLICATIONS

Riffle and Clark, "A Monolithic Low Power PCM Repeater Circuit", IEEE Journal of Solid–State Circuits, vol. SC–No. Feb. 1979, pp. 102–108.

Davis et al., "Design of an Integrated Circuit for the TIC Low-Power Line Repeater", IEEE Journal of Solid–State Circuits, vol. SC 14 No. Feb. 1979, pp. 109–120.

Merrill, "Conversion from 100% Duty Cycle Binary Data to 50% Duty Cycle Bipolar Data", BTL Electronics Letters, Jan. 1979.

*Primary Examiner*—Benedict V. Safourek
*Assistant Examiner*—Stephen Chin
*Attorney, Agent, or Firm*—J. P. Kearns; H. L. Newman

[57] ABSTRACT

A system for generating a drift-free three-level pulse signal from a two-level input signal involves an improvement over prior art in that output transformers are eliminated. This system is compatible with integrated circuit techniques using solid state logic elements in conjunction with a capacitor-resistor combination at the output.

7 Claims, 5 Drawing Figures

TRANSFORMERLESS BIPOLAR CONVERTER

TECHNICAL FIELD

This invention relates to apparatus and method for converting unipolar two-level pulse transmission to the three-level bipolar format.

BACKGROUND OF THE INVENTION

In this specification unipolar pulses mean pulses of equal amplitude representing the sense of binary data by their polarity with the convention that the positive polarity represents the binary "1" and the negative polarity, the binary "0". By bipolar code is meant a three-level code in which the center or reference level, e.g., zero voltage, represents data of one binary sense and either outer level, whether positive or negative, represents the other binary sense with the convention that the inner level represents the binary "1" and the outer levels in alternation represent the binary "0".

In the past circuits for converting unipolar to bipolar code commonly used a center-tapped transformer in the output stage to produce positive and negative pulses from a single-polarity supply voltage. An example of this type of circuit is taught by Riffle, Clark, Chen and Gilbert in FIG. 2 (page 102, lower right corner) of their article, "A Monolithic Power PCM Repeater Circuit", published in *Institute of Electrical and Electronics Engineers, Inc., Journal of Solid State Circuits*, Vol. SC-14, No. 1, February 1979. Also in the same journal at page 109, Davis, Gracyk and Griffin in their article, "Design of An Integrated Circuit for the T1C Low-Power Line Repeater", teach bipolar converter technology in which a center-tapped transformer is used for unipolar to bipolar conversion. In many prior art systems the transformer is also used as a power separation filter in a simplex d-c power scheme. The use of a transformer imposes limitations on circuit design that heretofore have not been addressed. Many times the use of a transformer is incompatible with integrated circuit technology because the discrete transformer does not fit within the size constraints required by this circuit technology.

It is known that unipolar to bipolar conversion utilizes transformers to produce positive and negative pulses from a single-polarity supply voltage. It is also known that the transformers can cause size limitation problems in conjunction with integrated circuit technology. This size limitation problem is a serious one and has to be remedied if small integrated circuits are to be used.

The converter circuit of this invention eliminates the transformer from the circuit configuration. Without a transformer in the circuit, a unipolar to bipolar circuit can be constructed entirely with small integrated components.

SUMMARY OF THE INVENTION

According to this invention, a transformerless circuit for converting a two-level input data signal to a three-level output data signal comprises logic circuitry, an inhibited circuit which capacitively couples a binary data source to a transmission line and a memory circuit for storing the polarity of the last-transmitted pulse. When the inhibited circuit is disabled by the occurrence of a binary 1 under the above-mentioned convention, a high impedance state is present; thus, no current can flow to the output load and the output voltage is zero, thereby representing one level of the three-level output. When the inhibited circuit is enabled by the occurrence of the complementary binary state, the output can either be high to cause a positive pulse to appear at the output because the output is connected to a voltage source, or when the output of the inhibited circuit is low, to cause a negative pulse to appear at the output because the positively charged end of the capacitor is connected to ground. The memory circuit controls the polarity of the output pulses on an alternating basis. This bipolar converter circuit, because it needs no transformer, can be constructed in integrated-circuit form.

BRIEF DESCRIPTION OF THE DRAWING

The advantages of my invention will become apparent from the following detailed description and the drawing in which.

DETAILED DESCRIPTION

A bipolar converter performs the function of unipolar to bipolar conversion. Unipolar transmission can be characterized as the transmission of a logical 1 by means of a pulse at one voltage level and a logical 0, by means of a pulse at a negative voltage level of the same magnitude. In contrast, in bipolar transmission, one data sense, e.g., the logical 1 is represented by the absence of a pulse, i.e., by some reference voltage, conveniently 0 volts, and the other data sense is represented by the presence of a pulse which alternates between positive and negative levels of like magnitude. Consequently, a transition between positive and negative levels occurs for transmitted logical elements of one sense and zero level drift is substantially eliminated. Furthermore, the average line transmission rate is reduced to one-half that of the data transmission rate.

Figure 1:
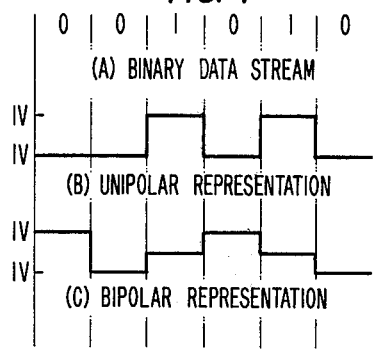
FIG. 1 shows waveforms associated with the bipolar converter.

FIG. 1 is a representation of the binary data stream and of the corresponding idealized waveforms for the unipolar and bipolar equivalents. The binary data at the input of the bipolar converter are represented by 1 or 0, where 1 is high and 0 is low. For example, in unipolar notation a 1 may be represented by a level of +1 volt and a 0 may be represented by a level of −1 volt.

Line (A) shows a representative binary data stream as 001010, where the 0's and 1's are data bits of opposite sense. Waveform (B) depicts the data in unipolar format; i.e., logical 1 and 0 are coded as respective positive and negative voltage levels of like amplitude, e.g., one volt. Waveform (C) shows the binary data stream of waveform (A) in bipolar format in which logical 0 bits are coded alternately as positive and negative voltage levels of one-volt magnitude and all logical 1 bits are coded at a reference level of zero volts.

FIG. 1 is one representation of unipolar to bipolar waveforms. For example, the unipolar representation of logical 1's and 0's is not limited to plus and minus 1 volt. Similarly, a logical 0 in unipolar could be represented by a reference voltage (0 volts) in bipolar and a stream of logical 1's could alternate between some positive and negative levels of like magnitude.

Figure 2:
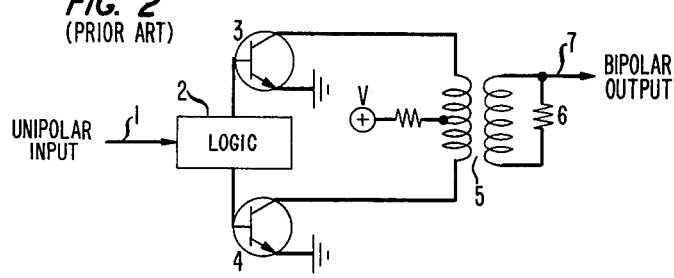
FIG. 2 is an illustrative embodiment of a prior art bipolar converter.

A typical prior art unipolar-to-bipolar system is illustrated in FIG. 2. This circuit comprises, respectively, a logic circuit 2, switching transistors 3 and 4, transformer 5 and load resistor 6. The unipolar data enters at input 1 of logic circuit 2. The control outputs of logic circuit 2 are connected to npn transistors 3 and 4. The collectors of transistors 3 and 4 are in turn connected to the primary side of transformer 5, which is shown with a center tap connected through a buffer resistor to single-polarity voltage source V. The secondary winding of transformer 5 is connected across load resistor 6 where bipolar data output 7 is taken. Logic circuit 2 is arranged so that a logical 1 at input 1 leaves both transistors 3 and 4 biased off, leaving no voltage across load 6. Alternately, when a logical 0 appears at the input, either transistor 4 is turned on and transistor 3 is off to cause the bottom of the primary winding of transformer 5 to be connected to ground and a positive pulse appears at the output 7; or transistor 3 is turned on and transistor 4 is off to cause the top of the primary winding of transformer 5 to be connected to ground, and a negative pulse appears at the output 7. This circuit will therefore take a unipolar code in which logical 1's are transmitted at a $+1$ voltage level and logical 0's are transmitted at a $-1$ voltage level and change it into a bipolar code in which logical 1's in unipolar become 0 volts in bipolar and logical 0's in unipolar alternate in polarity between $+1$ and $-1$ volts in bipolar format. Thus, a two-level signal (unipolar coding) is converted into a three-level signal (bipolar coding).

Unipolar transmission by its very nature will cause undesirable voltage buildup on system components if a large string of logical 0's or logical 1's are transmitted; bipolar transmission, on the other hand, minimizes this voltage buildup in the above-mentioned manner. This is advantageous since bias voltages can distort transmitted data at both the sending and receiving ends of a transmission line.

This prior art embodiment as before mentioned requires a center-tapped transformer for proper operation of the circuit. Discrete transformers require a finite physical space. Many times in conjunction with this technology small integrated circuits and the like are used to implement circuits. Transformers and other inductive elements are not currently available in integrated-circuit form. The size constraints imposed by the use of the transformer therefore could preclude the use of a bipolar converter in small integrated circuit technology. The drift problem before mentioned concerning the accumulation of bias voltages could not be attacked through the use of a bipolar converter if there was not sufficient space to use the transformer necessary for the operation of the prior art embodiment.

Figure 3:
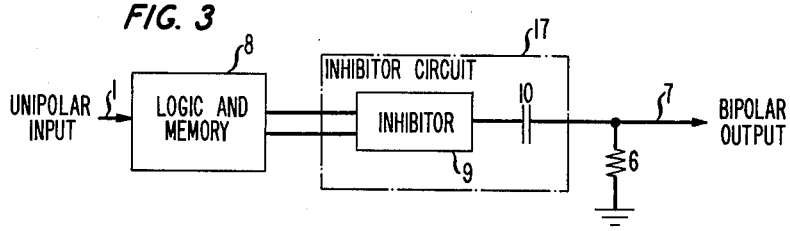
FIG. 3 is the bipolar converter in block diagram form.

In our invention, the transformer is eliminated to facilitate the use of a bipolar converter in integrated circuit technology. FIG. 3 shows in block diagram form the transformerless bipolar converter of this invention. This circuit comprises logic and memory circuit 8, inhibitor circuit 17 which further comprises inhibitor 9 and capacitor 10, and load resistor 6. In this embodiment the unipolar data appearing at input 1 enters logic circuit 8 whose output in turn is connected to inhibitor 9. Inhibitor 9 is connected to the capacitor 10 which is series connected to load resistor 6, where the output pulse is available at output terminal 7. Logic circuit 8 provides discrete outputs indicative of the input binary state to inhibitor circuit 17. When inhibitor circuit 17 is in its high impedance (zero voltage) state, no current can flow through capacitor 10 to load resistor 6 and the voltage at terminal 7 is zero. When the output of inhibited circuit 9 is high, capacitor 10 charges in a direction to cause a positive pulse to appear across resistor 6. When the output inhibitor circuit 17 is low, capacitor 10 discharges in a direction to cause a negative pulse to appear across resistor 6.

Figure 4:
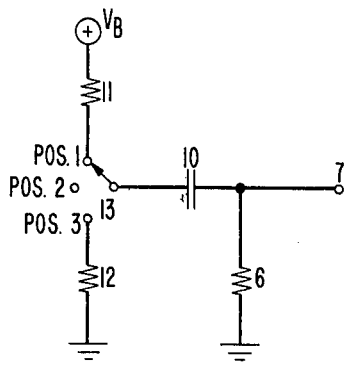
FIG. 4 is the equivalent circuit of the inhibited circuit.

FIG. 4 is the equivalent circuit of inhibitor circuit 17 of FIG. 3. In this equivalent circuit resistor 6 is the load resistance $R_L$; capacitor 10 is in series with resistor 6; switch 13 is a three-position transfer switch; and resistors 11 and 12 provide respective connections between switch contacts as shown and voltage source $V_B$ and ground. In position 1 of switch 13 a charging path for capacitor 10 is established from voltage source $V_B$ to ground through resistors 11 and 6, whereby a positive voltage appears across resistor 6 at terminal 7. In position 2 of switch 13 the charging path is interrupted and no current flows through either capacitor 10 or resistor 6, whereby no voltage appears across resistor 6 and output terminal 7 is grounded. In position 3 of switch 13, a discharging path for capacitor 10 is established through resistors 12 and 6 to ground, whereby a negative voltage appears across resistor 6 at terminal 7.

In position 1 of switch 13, while capacitor 10 is charging, the output voltage across resistor 6 can be approximated by the equation below:

$$V_o = \frac{(V_b - V_c) \times R_L}{(R_1 + R_L)}, \tag{1}$$

where
$V_o$ = output voltage across resistor 6,
$V_b$ = source voltage,
$V_c$ voltage across capacitor 10,
$R_1$ = resistance of charging resistor 11, and
$R_L$ = resistance of load resistor 6.

Therefore, the voltage at terminal 7 is a positive voltage.

In the high impedance state (position 2 of switch 13) where the series connected capacitor 10 and load resistor 6 are attached to an infinite resistance, the voltage at terminal 7 is 0 volts as no current is flowing in resistor 6. In this position the voltage $V_c$ is stored in capacitor 10. Therefore, the voltage at terminal 7 across load resistor 6 is 0 volts.

Finally, in position 3 of switch 13 capacitor 10 discharges to ground through resistors 6 and 12. Therefore, the output voltage across resistor 6 can be approximated by the following equation:

$$V_o = -\frac{V_c \times R_L}{R_2 + R_L}, \tag{2}$$

where
$V_c$ = output voltage across resistor 6,
$V_c$ = voltage across capacitor 10,
$R_2$ = resistance of discharging resistor 12, and
$R_L$ = resistance of load resistor 6.

Therefore, the voltage at terminal 7 is a negative voltage.

It can be shown through derivation that if $$\frac{\Delta T_1}{(R_1 + R_L)C} < 0.1 \tag{3}$$

-continued and $$\frac{\Delta T_3}{(R_2 + R_L)C} < 0.1 \qquad (4)$$

where $\Delta T_1$ is the amount of time $R_1$ is connected to switch 13, $\Delta T_3$ is the amount of time $R_2$ is connected to switch 13, and $$\Delta T_1 = \Delta T_3, \qquad (5)$$

then the magnitude of the output voltage is the following relation:

$$|V_o| = V_b \frac{R_L}{R_1 + R_2 + 2R_L}. \qquad (6)$$

This relation represents the magnitude of the positive and negative pulses (i.e., positions 1 and 3) of the output voltage. $R_1$ and $R_2$ are the source resistances of the inhibited device and in some cases may not be easily controllable.

Figure 5:
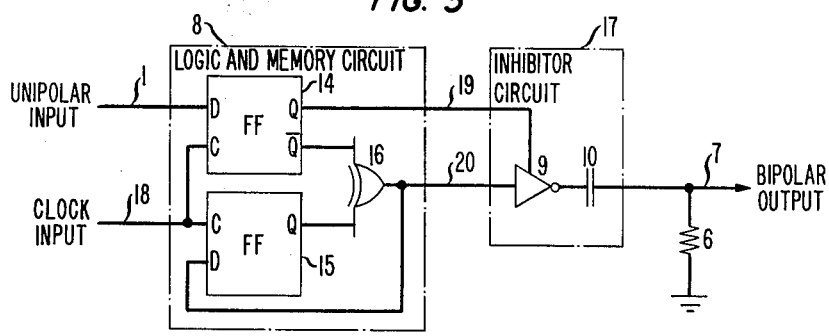
FIG. 5 is an illustrative embodiment of the bipolar converter.

FIG. 5 shows a illustrative embodiment of a bipolar converter according to this invention. The converter circuit comprises logic and memory unit 8, inhibitor circuit 17 and output load resistor 6. Logic and memory unit 8 further comprises clocked D flip-flops 14 and 15 and exclusive-OR gate 16. Inhibitor circuit 17 further comprises inhibited inverter 9 and capacitor 10. Output load resistor 6 includes output terminal 7 and a ground connection. Flip-flops 14 and 15 have a common clock input at terminal 18. Unipolar data at terminal 1 enter flip-flop 14 at its data input D. A clock signal is applied to terminal 18 to clock input C. If the unipolar input is high (logical 1), the Q output of flip-flop 14 goes high and an inhibiting output appears on lead 19 to disable inhibitor circuit 17. If the unipolar input is low (logical 0), the $\bar{Q}$ output of flip-flop 14 is high and exclusive OR gate 16 connected thereto is enabled. At the same time the inhibiting signal on lead 19 is removed. The output of gate 16 now goes high or low, depending on the Q output state of flip-flop 15 in accordance with the like-unlike operating rule for exclusive-OR gates. If the Q state of memory flip-flop 15 were low, then the output of gate 16 at lead 20 would follow the $\bar{Q}$ state of flip-flop 14. On the other hand, if the Q state of flip-flop 15 were high, then the output of gate 16 at lead 20 would be the inverse or complement of the $\bar{Q}$ state of flip-flop 14. The output state of gate 16 causes flip-flop 15 to toggle coincident with an input at clock input C between high and low output states. Accordingly, if a string of logical 0's presents itself at unipolar input 1 of logic and memory unit 8, the output of the exclusive-OR gate 16 at lead 20 alternates between high and low voltage levels through the combined operation of exclusive-OR gate 16 and memory flip-flop 15. The high and low states occurring at lead 20 are inverted by inverter 9 to cause capacitor 10 to charge and discharge alternately, thereby producing alternate positive and negative voltage pulses across load resistor 6 at output terminal 7.

This illustrative embodiment is just one representation of the invention. It should therefore be understood by those skilled in the art that a series of logical 1's at unipolar input 1 of logic and memory unit 8 could be represented as the high and low voltage levels at lead 20 and conversely logical 0's at input 1 could be represented by the high impedance or open circuit state.

The above-mentioned embodiment can use integrated circuit technology and is readily adaptable to very small integrated circuits. This technique can be used in data transmitters and the like where an important objective is to produce highly miniaturized circuit components of which the bipolar converter is an integral part. This embodiment can be implemented in circuits that have logic devices and it is desirable that these logic devices be part of a single integrated circuit. This embodiment also will find use in circuitry which controls the multiplexing function of the data transmitter. Finally, this technique should prove to be generally useful in the adaptation of miniaturized circuits to this technology.

While this invention has been disclosed by means of a specific illustrative embodiment, the principles thereof are capable of a wide range of modification by those skilled in the art within the scope of the following claims:

What is claimed is:

1. Apparatus for converting a two-level input signal to a three-level output signal such that one of the two levels of the input signal is coded as the center level of the three levels and the other of the two levels of the input signal is coded alternately as one or the other of the outer levels of the output signal, the apparatus comprising;
   means for alternately charging and discharging a capacitor through a load resistor responsive to successive occurrences of the other of the two levels of the input signal; and
   means for inhibiting the charging or discharging of the capacitor through the load resistor responsive to the occurrence of the one of the two levels of the input signals,
   the alternately charging and discharging means providing one or the other of the outer levels of the three level output signal across the load resistor,
   the inhibiting means providing the center level of the three level output signal across the load resistor.

2. An arrangement for converting a two-level data input signal to a three-level output signal such that one of the two levels of the input signal is coded as a center level of the three levels and the other of the two levels of the input signal is coded alternately as one or the other of the outer levels of the output signal comprising,
   logic circuit means with an input and first and second outputs, the logic circuit means separating the two levels of the input signal onto distinct outputs,
   inhibit circuit means with two inputs and an output, the inputs of the inhibit circuit means being respectively connected to the first and second outputs of the logic circuit means; and
   a resistor means connected between the output of the inhibit circuit means and a ground,
   the first output of the logic circuit means providing a signal corresponding to the one level of the input signal for preventing the inhibit circuit means from functioning, and resulting in the center level of the three level output signal being provided across the resistor means and
   the second output of the logic circuit means providing a signal corresponding to the other level of the input signal for allowing the inhibit circuit means to function, resulting in one or the other of the outer levels of the three level output signal being provided across the resistor means.

3. The arrangement of claim 2 in which said inhibit circuit means comprises
inhibitor means with a pair of inputs and an output, and a capacitor,
one end of the capacitor being connected to the output of the inhibitor means and the other end of the capacitor being connected to the resistor means,
the inhibitor means inhibiting the charging and discharging of the capacitor responsive to the occurrence of the one of the two levels of the input signal and the inhibitor means permitting the capacitor to be alternately charged and discharged through the resistor means responsive to successive occurrences of the other of the two levels of the input signal.

4. The arrangement of claim 2 in which said logic circuit means comprises
first and second flip-flop means with inputs and outputs, an input to the first flip-flop means receiving said two-level input signal,
means for connecting a first output of the first flip-flop to control the inhibit circuit means,
exclusive-OR means having two inputs and an output, the output of the exclusive-OR means connected to an input of the second flip-flop means as a memory means, the output of the exclusive-OR means connected to the input of the inhibit circuit means, and
means for connecting a second output of the first flip-flop and an output of the second flip-flop to the inputs of the exclusive-OR means.

5. The arrangement of claim 2 in which the inhibit circuit means comprises;
an inverter with two inputs and an output, the inputs of the inverter connected to the outputs of the logic circuit means; and
a capacitor, one side of which is connected to the output of the inverter; the other side of which is connected to the resistor means.

6. The arrangement of claim 3 in which the inhibitor means is an inverter.

7. Apparatus for converting a two-level input signal to a three-level output signal such that one of the two levels of the input signal is coded as a center level of the three levels and the other of the two levels of the input signal is coded alternately as one or the other outer level of the output signal,
the apparatus comprising,
an inhibit means with an input and an output,
the inhibit means responsive to the other of two levels of the input signal and inhibited by the one of the two levels, of the input signals, and
a capacitor and a load resistor connected in series to the output of the inhibit means and a ground, the inhibit means preventing the capacitor from charging or discharging through the load resistor responsive to the occurrence of the one of the two levels of the input signal, resulting in the center level of the three level output signal being provided across the load resistor, the inhibit means allowing the capacitor to be alternately charged and discharged through the load resistor responsive to successive occurrences of the other of the two levels of the input signal, resulting in the outer levels of the three level output signal being provided across the load resistor.

* * * * *